United States Patent [19]
Hill

[11] Patent Number: 5,486,793
[45] Date of Patent: Jan. 23, 1996

[54] BALANCED RF OSCILLATOR AND TRANSMITTER

[75] Inventor: John P. Hill, Westland, Mich.

[73] Assignee: United Technologies Automatove, Inc., Dearborn, Mich.

[21] Appl. No.: 342,721

[22] Filed: Nov. 21, 1994

[51] Int. Cl.⁶ .............................. H03B 5/36; H04L 27/04
[52] U.S. Cl. .......................... 331/56; 331/60; 331/107 A; 331/114; 332/109; 340/825.69; 375/238; 455/129
[58] Field of Search ................................ 331/45, 56, 100, 331/102, 107 A, 107 P, 116 R, 116 FE, 117 R, 117 FE, 60, 114; 455/129; 340/825.69, 825.72; 332/109; 375/238

[56] References Cited

U.S. PATENT DOCUMENTS

| | | | |
|---|---|---|---|
| 5,138,284 | 8/1992 | Yabuki et al. | 331/100 |
| 5,367,537 | 11/1994 | Anderson | 332/102 |
| 5,422,605 | 6/1995 | Yang et al. | 331/75 |

FOREIGN PATENT DOCUMENTS 1603627  11/1981  United Kingdom ...................... 331/45

OTHER PUBLICATIONS

Branislav Petrovic, "A Balanced RF Oscillator", rfdesign Dec. 1989 pp. 35–38.
Robert Matthys, "A High Performance VHF Crystal Oscillator Circuit" rfdesign Mar. 1987 pp. 31–38.
Nick Demma, "Balanced Meissner Oscillator Circuits" RF design Dec. 1993 pp. 72–74.
Gary A. Breed, "A Basic Review of Feedback" RF design Apr. 1993 pp. 62–64.
Craig Taylor & David Kenny, "Basic Crystal Oscillator Design Considerations" RF design Oct. 1992 pp. 75–79.
Fred Brown, "Stable LC Oscillators" rfdesign Mar. 1987 pp. 54–61.
Harvey L. Morgan, "An Emitter Follower Oscillator" rfdesign Oct. 1988 pp. 61–62.

*Primary Examiner*—Siegfried H. Grimm

[57] ABSTRACT

A balanced oscillator and transmitter circuit is provided which includes a pair of balanced Colpitts-type oscillators for generating an enhanced power radiating output signal. The balanced oscillators share a series resonance input tank. Each oscillator has an amplification stage which preferably includes a Colpitts-type configured transistor. The transmitter circuit further includes first and second output tanks having first and second radiating elements which may include a pair of inductors. An oscillating current signal is generated by the oscillator and is commonly transmitted through the pair of radiating elements. Each radiating element transmits radiating output signals which are combined and summed in total to provide an efficient radiating output signal. Alternately, the first and second output tanks may include a center-tapped transformer coupled to a third radiating element.

18 Claims, 2 Drawing Sheets

BALANCED RF OSCILLATOR AND TRANSMITTER

BACKGROUND OF THE INVENTION

1. Technical Field

This invention relates generally to radio frequency (RF) transmitters and, more particularly, to a balanced oscillator and transmitter circuit having two oscillators connected in a back-to-back configuration and sharing a common tank circuit for radiating RF signals with enhanced power output.

2. Discussion

Compact radio frequency (RF) transmitters are widely employed to transmit radiating signals for use in connection with remote signal communication systems. For instance, a wide variety of compact transmitters are commonly used with automotive vehicle remote keyless entry systems for remotely controlling access to a vehicle in addition to controlling other vehicular functions such as alarm system features, trunk release, etc. Similarly, compact transmitters are also widely used for remotely controlling the operations provided with automatic garage door systems, electronic sound systems, televisions and VCRs. The types of compact hand held transmitters often employed for such purposes are usually battery operated and are generally required to accommodate a compact enclosure and to exhibit efficient power usage. According to well known signal communication systems, the transmitter typically radiates an encoded RF signal with a predetermined carrier frequency. Generally speaking, the radiating signal is picked up with a remote receiver and processed, if necessary, and then provided as a control signal to a motor controller or other control device for a given system.

A number of conventional RF transmitters currently employ a single Colpitts oscillator for providing a local oscillation signal in the transmitter circuit. As an example, FIG. 1 illustrates a conventional transmitter circuit 10 employing a conventional single Colpitts-type oscillator which produces the local oscillation signal for transmission from an antenna element. This particular conventional transmitter circuit 10 has been commonly used in connection with a remote controlled keyless entry system for automotive vehicles.

More particularly, the conventional transmitter circuit 10 of FIG. 1 has a single Colpitts oscillator made up of a Colpitts-configured transistor Q1, and an input tank circuit. The input tank circuit typically includes a series resonator such as a surface acoustic wave (SAW) resonator 12 as well as feedback capacitors C1 and C2. The oscillator also includes a number of biasing resistors. The conventional transmitter circuit 10 also has an inductor L1 that is employed as a radiating antenna element for radiating the RF output signal. The Colpitts-configured transistor Q1 of the conventional transmitter circuit 10 has a base terminal 14 coupled to the surface acoustic wave resonator 12 and a collector terminal 16 coupled to the inductor L1. Transistor Q1 also has an emitter terminal 18 coupled to ground via a resistor R3. In addition, a feedback capacitor C2 is also coupled between emitter terminal 18 and ground, and therefore is connected in parallel with resistor R3. The feedback capacitor C1 is coupled between the collector terminal 16 and emitter terminal 18 of transistor Q1. Additionally, a third capacitor C3 is shown coupled between inductor L1 and ground for providing a large capacitance which maintains a constant DC voltage.

The circuit configuration according to the above-described conventional single oscillator transmitter circuit 10 typically receives a direct current (DC) voltage input signal $V_{IN}$ such as +6 volts DC. In addition, transmitter circuit 10 also receives a data input signal $V_{data}$ for encoding the RF carrier signal with pulse-width modulations. In response, circuit 10 operates to generate a radiating output signal via inductor L1. In doing so, the Colpitts-configured transistor Q1 acts as an amplification stage and, together with the tank circuit, generates a resonating signal which is provided as an oscillating current signal I through inductor L1. The transmission of current I through inductor L1 in turn causes transmission of the radiating output signal which is generally distributed as an electromagnetic field.

The above-described conventional single Colpitts oscillator approach has been suitable for providing RF signal transmission for applications such as the remote keyless entry system for a vehicle. However, the conventional single Colpitts oscillator is limited in the amount of power output that is generally achievable according to the conventional circuit configuration. Generally speaking, the size of the radiating inductor L1, may not simply be enhanced to achieve an increase in power output due to inherent limitations associated with the commonly employed circuit components. While attempts to enhance output power have considered optimization of component values, limitations remain which may include matching losses that are generally associated therewith. Further, rail-to-rail voltage swing limitations of the transistor Q1 tend to limit the amount of current flow through the conventional circuit. This in turn curtails the available power output that may be realized by a given transmitter circuit.

It is therefore one object of the present invention to provide for a remote balanced oscillator and transmitter for radiating RF signals and which is capable of achieving an enhanced power output over that of a conventional single oscillator type transmitter.

More particularly, it is an object of the present invention to provide for a balanced oscillator and transmitter circuit which employs a pair of balanced back-to-back Colpitts-type oscillators, a common tank circuit and a pair of series connected output tanks with antenna elements to achieve enhanced power output.

It is another object of the present invention to provide for a method of efficiently generating and transmitting an RF signal which may realize increased power output.

It is also a further object of the present invention to provide for a compact balanced oscillator and transmitter circuit and method of achieving an efficient transmission of a radiating signal which is capable of offering increased power output and is suitable for use in connection with a vehicular keyless entry system.

SUMMARY OF THE INVENTION

A balanced oscillator and transmitter circuit and method are provided for generating and transmitting a radiating RF output signal. The transmitter circuit includes an RF oscillator which has first and second amplification stages coupled between a series resonant input tank. Each amplification stage preferably has a transistor which is preferably provided in a Colpitts-type configuration. Each transistor has a base terminal coupled to the input tank. The transmitter circuit has an input for receiving a DC input voltage. The RF oscillator produces an oscillating current signal with a resonance carrier frequency. The transmitter circuit has a first output tank connected in series with the first amplification stage and a second output tank connected in series with the second amplification stage. The first and second output tanks have first and second radiating elements and are adapted to commonly receive the oscillating current signal and transmit radiating output signals in response thereto. The radiating signals transmitted from each of the first and second radiating elements of the output tanks add in summation so as to provide for transmission of an output radiating signal.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
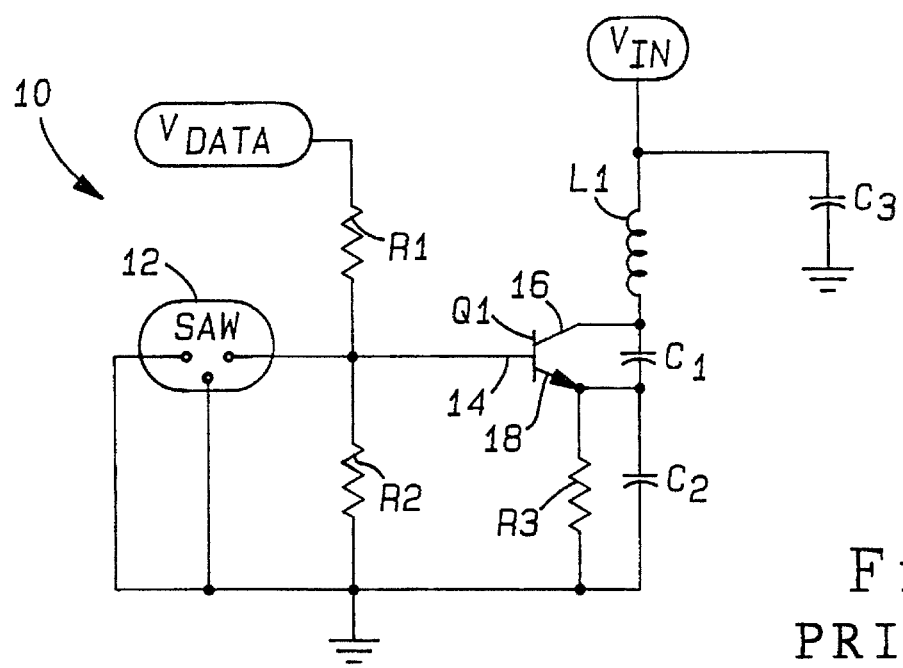
FIG. 1 is a circuit diagram illustrating a conventional single Colpitts-type oscillator and transmitter circuit.
Figure 2:
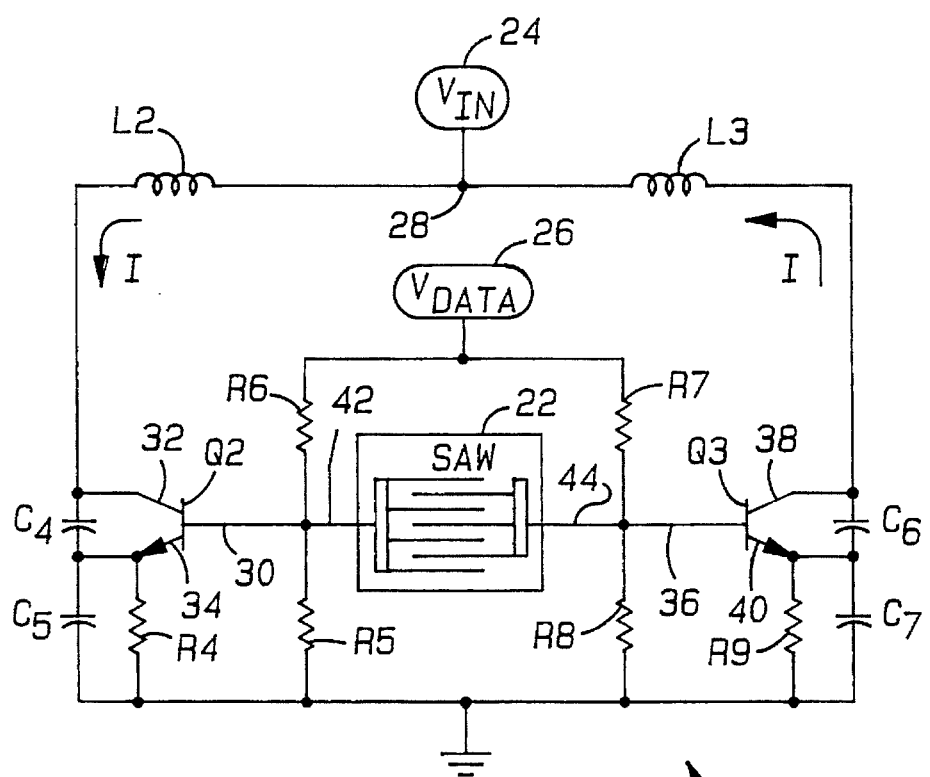
FIG. 2 is a circuit diagram illustrating a balanced Colpitts-type oscillator and transmitter circuit according to a preferred embodiment of the present invention.

Turning now to FIG. 2, a balanced oscillator and transmitter circuit 20 is shown therein according to one preferred embodiment of the present invention. Generally speaking, the balanced oscillator and transmitter circuit 20 of the present invention employs a circuit configuration which has two nose-to-nose connected Colpitts-type oscillators. The two Colpitts-type oscillators are balanced with respect to one another and share a common tank circuit and oscillating current signal I in a manner which allows for realization of an efficient power output. The particular transmitter circuit 20 described herein in connection with the preferred embodiments of the present invention is particularly desirable for use with remote keyless entry systems for automotive vehicles, however, other applications are clearly applicable.

According to a more detailed description, transmitter circuit 20 has a balanced oscillator configuration generally made up of two Colpitts-type oscillator circuits for producing a local oscillation signal within the transmitter circuit 20. The oscillator circuitry includes a first transistor Q2 and a second transistor Q3 connected together in a nose-to-nose configuration with a series resonant surface acoustic wave (SAW) resonator 22 connected therebetween. The SAW resonator 22 is a series resonant input tank for generating and stabilizing the oscillating current signal I to achieve a resonance RF carrier frequency.

More specifically, the first transistor Q2 is preferably a heterojunction bipolar transistor (HBT) which has a base terminal 30, a collector terminal 32, and an emitter terminal 34. Likewise, the second transistor Q3 is also preferably a heterojunction bipolar transistor (HBT) which has a base terminal 36, a collector terminal 38, and an emitter terminal 40. Each of transistors Q2 and Q3 operates as an amplification stage and each amplification stage provides a unity loop gain for steady state operations. According to one example, transistors Q2 and Q3 may each include a bipolar transistor type MMBTH10. Each of transistors Q2 and Q3 is preferably configured as an approximate Colpitts-type oscillator and each has tuned LC circuitry and positive feedback. However, it should be understood that various other transistor configurations could be employed without departing from the spirit of the present invention.

The series resonant surface acoustic wave (SAW) resonator 22 is a series resonant input tank circuit device shown and described herein according to a preferred embodiment. SAW Resonator 22 is coupled between the base terminals 30 and 36 of transistors Q2 and Q3 via resonator output lines 42 and 44, respectively. The SAW resonator 22 is shown having an array of metallic fingers which are formed on a piezoelectric substrate. As an example, SAW resonator 22 may include model number RO2073 manufactured and sold by RF Monolithics, Inc. The SAW resonator 22 advantageously operates to stabilize oscillations of the RF carrier signal.

The transmitter circuit 20 further has a pair of output tank circuits which include a first inductor L2 and a second inductor L3, both of which operate as antenna radiating elements for radiating an RF output signal in response to the commonly shared oscillating current signal I. The first inductor L2 is connected between the collector terminal 32 of transistor Q2 and node 28. The second inductor L3 is connected between the collector terminal 38 of transistor Q3 and node 28. Accordingly, inductors L2 and L3 are connected together at node 28 in a series connection. A voltage input source 24 is coupled to node 28 between inductors L2 and L3 for applying a DC voltage input $V_{IN}$ thereto. According to one example, voltage input signal $V_{IN}$ is a +volt DC signal. Application of the +volts between inductors L2 and L3 biases transistors Q2 and Q3 so as to allow for realization of the necessary gain. Inductors L2 and L3 each operate as an antenna transmitting device for emitting a radiating electromagnetic field exhibiting an oscillating signal with a predetermined carrier frequency.

The transmitter circuit 20 further has a data input 26 coupled to both of resonator output lines 42 and 44 via respective resistors R6 and R7. Data input 26 is adapted to receive an on/off data input signal $V_{data}$ which is applied to both sides of the surface acoustic wave resonator 22. Each of resonator output lines 42 and 44 are also coupled to ground via respective resistors R5 and R8. The data input signal $V_{data}$ encodes the carrier signal with pulse-width modulations to provide information on the carrier signal. This information may control various system operations such as a door lock actuation mechanism and may further control on/off operations of the oscillator and transmitter circuit 20. Application of data input signal $V_{data}$ may be initiated by manual control via a known actuation mechanism such as a push-button pad, switch or other pulsed activation device.

The surface acoustic wave resonator 22 provides for an input tank circuit which is commonly shared by the pair of balanced oscillators. Inductor L2 in combination with capacitors C4 and C5 provide for a first output tank circuit. Similarly, inductor L3 in combination with capacitors C6 and C7 provide for a second output tank circuit. While the series resonant input tank stabilizes oscillation of the resonating signal, the output tanks provide for radiation of the RF signal. Capacitors C4 and C5 also provide a voltage divider network and further provide a positive feedback path to the amplification stage provided by transistor Q2. Likewise, capacitors C6 and C7 also provide a voltage divider and further provide a positive feedback path to the amplification stage provided by transistor Q3. Energy is efficiently stored in the capacitors C4 through C7 and inductors L2 and L3 so as to enhance the radiation capability by reducing the amount of energy that may otherwise be required for each cycle of transistors Q2 and Q3.

Figure 3:
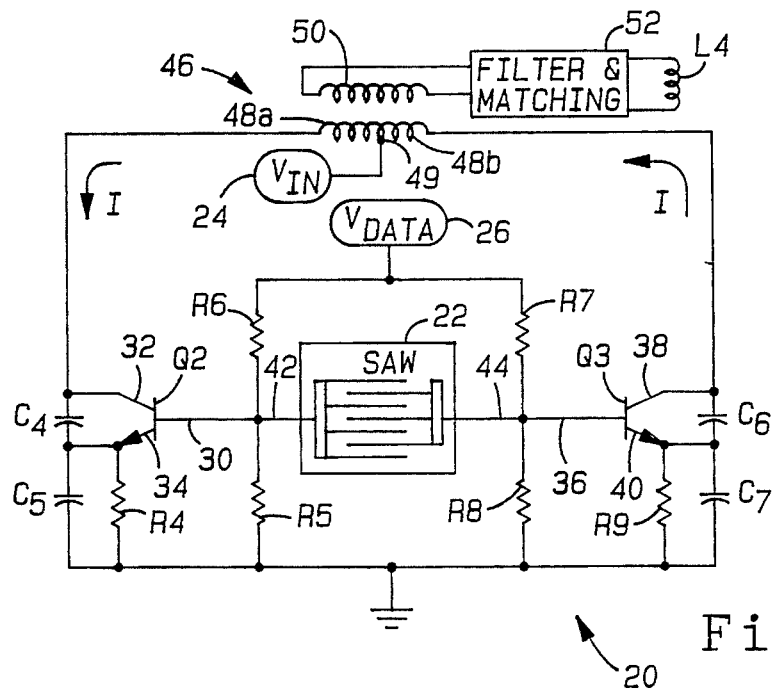
FIG. 3 is a circuit diagram of the balanced oscillator and transmitter circuit employing an alternate antenna radiating element circuit configuration.

Referring to FIG. 3, the transmitter circuit 20 may alternately be configured to include a center-tapped transformer 46 in lieu of the first and second inductors L2 and L3. According to the alternate embodiment, center-tapped transformer 46 has a primary winding made up of first primary winding portion 48a and second primary winding portion 48b. Primary winding portions 48a and 48b are preferably of substantially equal size. The voltage input source 24 is coupled to a center tap 49 located between the primary winding portions 48a and 48b of the primary winding and supplies the DC voltage input $V_{IN}$ thereto. Center-tapped transformer 46 also includes a secondary winding 50 located adjacent to the primary winding portions 48a and 48b. Transformer 46 is adapted to form a first magnetic coupling between primary winding portion 48a and the secondary winding 50 and a second magnetic coupling between primary winding portion 48b and secondary winding 50. The secondary winding 50 in turn is coupled on both ends to a filter and matching network 52. A pair of output lines extend from the filter and matching network 52 and are coupled to a radiating inductor L4 for radiating an output electromagnetic field therefrom.

According to the alternate embodiment of FIG. 3, the first and second primary winding portions 48a and 48b of the center-tapped transformer 46 each produce an electromagnetic field in response to the oscillating current signal I that is transmitted therethrough. The electromagnetic fields from each of primary winding portions 48a and 48b are thereby transmitted and induced onto the secondary winding 50 of the center-tapped transformer 46. The signals induced onto secondary winding 50 are summed together and the summed signal in turn is filtered to eliminate undesirable noise and further undergoes impedance matching via filter and matching network 52. The filtered and impedance matched signal is then passed through a radiating inductor L4 so as to transmit a single radiating output signal. Use of the center-tapped transformer 46 advantageously separates out the even harmonics and is generally better able to achieve enhanced control of the radiation of the radiating output signal.

Figure 4:
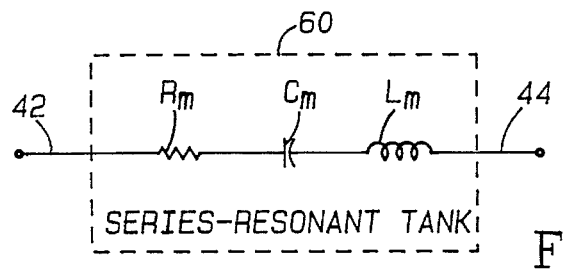
FIG. 4 is a circuit diagram illustrating an alternate series resonant input tank circuit configuration which may be employed in connection with the balanced oscillator and transmitter circuit.

It should be understood that the surface acoustic wave resonator 22 is a series-resonant input tank circuit which may be implemented with alternate comparable series resonant frequency stabilizing devices. As an alternative to the SAW resonator 22, the series resonant tank circuit may include a crystal device, microstrip or any other series-resonant structure or device that may achieve the desired stabilizing signal oscillation. With particular reference to FIG. 4, one alternative to the surface acoustic wave resonator 22 is provided and includes a resistor $R_M$, capacitor $C_M$ and inductor $L_M$ all connected in series to make up a series resonant tank circuit 60. The resonant frequency of the tank circuit 60 is generally determined by the size of the inductor $L_M$ and capacitor $C_M$. The size of resistor $R_M$ in combination with inductor $L_M$ and capacitor $C_M$ should be selected to provide for the desired Q value.

In operation, the transmitter circuit 20 receives a DC input voltage signal $V_{IN}$ via voltage input source 24. In addition, data input $V_{data}$ may also be received via data input 26 to encode the carrier RF signal with predetermined pulse-width modulations. Initially, the transmitter circuit 20 will generally begin to form a resonating signal which will initially start up and build to a steady state energy level with oscillations provided at a known frequency. In doing so, transistors Q2 and Q3 will cycle between the collector terminal 38 and emitter terminal 40 in response to noise or other induced signals and will build until the steady state is reached. During start-up, each amplification stage will generally provide a gain in excess of unity. At steady state, the gain of each amplification stage is approximately equal to unity or slightly greater than unity to account for any energy loss. The series resonant tank circuit with the surface acoustic wave resonator 22 will maintain and ensure stability of the signal oscillation within the transmitter circuit 20. The oscillating signal in turn will be exhibited by the current signal I which flows through the antenna radiating elements such as inductors L2 and L3. In addition, the feedback paths provided via capacitors C4 and C5 and capacitors C6 and C7 will provide a phase delay which will adjust the loop time so as to realize the desired frequency.

Figure 5:
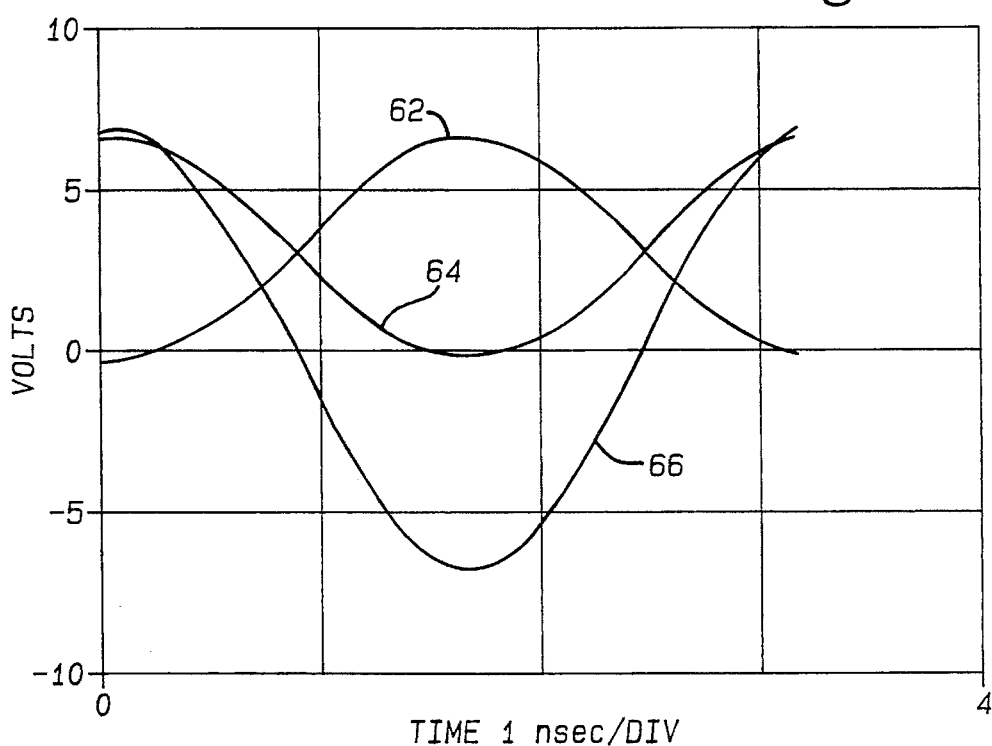
FIG. 5 is a graphical representation of voltage waveforms achieved in connection with one example of the balanced oscillator and transmitter circuit of the present invention.

According to the transmitter circuit 20 embodying inductors L2 and L3, inductors L2 and L3 each radiate a separate signal via separate electromagnetic fields, both of which have the same carrier frequency in response to the commonly shared oscillating current signal I. According to one example, the radiating output signals from inductors L2 and L3 and the total summed radiating output are illustrated by the waveforms provided in FIG. 5. The first radiating output signal transmitted from inductor L2 is shown by voltage waveform 62, while the second radiating output signal transmitted from inductor L3 is shown by voltage waveform 64. Voltage waveforms 62 and 64 are characterized by equal amplitudes and a 180 degree phase relationship relative to one another. The radiating signals 62 and 64 emitted from inductors L2 and L3 as shown in FIG. 5 were measured with respect to node 28 and therefore exhibit the phase shift of approximately 180 degrees relative to each other. Since waveforms 62 and 64 are measured relative to node 28, the summation of the two waveforms 62 and 64 relative to the commonly shared current signal I results in a summation as provided by voltage waveform 66. Accordingly, a single radiating output signal 66 may be achieved via the pair of balanced oscillators and output tanks in accordance with the present invention.

The single radiating output signal 66 according to this particular example has a frequency of approximately 315 MHz. Additionally, the separate outputs from inductors L2 and L3 of the first and second output tanks are balanced signals which are symmetric with respect to node 28 which, according to the example provided herein, is set at ∓volts DC. With the use of the center-tapped transformer 46, according to the alternate embodiment, the separate radiating signals could be summed and then filtered and impedance matched prior to transmission.

The balanced oscillator and transmitter circuit 20 may be mounted within a compact enclosure and advantageously employed to transmit control signals, especially for use in connection with a remote controlled keyless entry system for automotive vehicles. For such an application, an operator may manually activate the $V_{data}$ input to encode the RF carrier signal with selected information. The carrier signal and modulating information are radiated from the transmitter circuit 20 via the output tanks. A receiver which is generally mounted within a vehicle will receive the radiating signal, decode the modulation information thereon and execute the selected operation such as locking or unlocking a vehicle door, activating or deactivating an alarm system, etc. In contrast to conventional approaches, the transmitter circuit 20 advantageously achieves increased output power and maintains an efficient power usage therewith.

It should be apparent that the balanced oscillator and transmitter circuit 20 of the present invention may use various size components and such components may be modified without departing from the invention. As one example, inductors L2 and L3 each provide an inductance of approximately 40 nH. Capacitors C4 and C6 each may have a capacitance of approximately 4.7 pF, while capacitors C5 and C7 each have a capacitance of about 22 pF. Resistors R6 and R7 may each have a resistance of about 15 kΩ. Each of resistors R5 and R8 may have a resistance of about 6.8 kΩ, while resistors R4 and R9 each have a resistance of about 180 kΩ. Given an input voltage $V_{IN}$ of ±volts DC, the transmitter circuit 20 may achieve an oscillating RF current signal I of approximately 79 mA peak-to-peak. The circuit may realize a bias current of approximately 6 mA and, in accordance with the illustrative waveforms of FIG. 5, produces a 315 MHz signal. Thus, one is able to achieve enhanced far-field effective radiating RF energy with the present invention.

While this invention has been disclosed in connection with particular examples thereof according to a number of embodiments, no limitation is intended thereby except as defined in the following claims. This is because a skilled practitioner recognizes that other modifications can be made without departing from the spirit of this invention after studying the specification and drawings.

What is claimed is:

1. A transmitter circuit for radiating RF energy comprising:
   a balanced RF oscillator for generating an oscillating current signal, said oscillator including:
      a first amplification stage;
      a second amplification stage; and
      an input tank coupled to the first and second amplification stages;
   a first output tank coupled to the first amplification stage for radiating first RF energy;
   a second output tank coupled to the second amplification stage for radiating second RF energy; and
   means for coupling the first output tank to the second output tank in series so that the first and second output tanks share the oscillating current signal.

2. The transmitter circuit as defined in claim 1 wherein said first and second output tanks each comprise an inductor for radiating the output signals in response to the oscillating current signal.

3. The transmitter circuit as defined in claim 2 wherein each of the first and second output tanks further comprises a capacitor.

4. The transmitter circuit as defined in claim 1 further comprising a first positive feedback path coupled to the first amplification stage and a second positive feedback path coupled to the second amplification stage.

5. The transmitter circuit as defined in claim 1 wherein said first and second amplification stages each comprise a transistor having a base, a collector and an emitter, with the base terminals of each transistor coupled together via the input tank.

6. The transmitter circuit as defined in claim 1 wherein the first and second output tanks comprise a primary winding of a center-tapped transformer which combines said first and second radiating energy onto a secondary winding and radiates an output signal via a third radiating element.

7. The transmitter circuit as defined in claim 6 further comprising a filter and matching circuit coupled between said secondary winding and the third radiating element.

8. The transmitter circuit as defined in claim 1 wherein the input tank comprises a series resonant surface acoustic wave resonator.

9. An RF transmitter circuit for radiating energy comprising:
   a balanced RF oscillator for generating an oscillating current signal, said oscillator including:
      a first amplification stage having a first transistor with a base, a collector and an emitter;
      a second amplification stage having a second transistor with a base, a collector and an emitter; and
      a series resonant input tank coupled between the base of the first transistor and the base of the second transistor;
   a first output tank coupled to the first transistor and having a radiating element for radiating a first output signal in response to said oscillating current signal;
   a second output tank coupled to the second transistor and having a second radiating element for radiating a second output signal in response to the oscillating current signal; and
   means for serially coupling the first output tank to the second output tank so as to commonly share the oscillating current signal so that the first and second radiating output signals sum together to provide a single radiating output signal.

10. The transmitter circuit as defined in claim 9 wherein the first output tank comprises a first inductor coupled to the collector of the first transistor and the second output tank comprises a second inductor coupled to the collector of the second transistor.

11. The transmitter circuit as defined in claim 10 wherein said first and second output tanks each further comprise a capacitor.

12. The transmitter circuit as defined in claim 9 further comprising a first positive feedback path coupled to the first transistor and a second positive feedback path coupled to the second transistor.

13. The transmitter circuit as defined in claim 9 wherein said first and second radiating elements comprise a primary winding of a center-tapped transformer which combines the first and second signals onto a secondary winding and radiates a single output signal via a third radiating element.

14. The transmitter circuit as defined in claim 13 further comprising a filter and matching circuit coupled between the secondary winding and the third radiating element.

15. The transmitter circuit as defined in claim 9 further comprising an input for receiving a DC voltage signal.

16. The transmitter circuit as defined in claim 15 wherein said input is coupled between the first and second output tanks.

17. A method of generating and transmitting an oscillating RF signal comprising:
   producing a resonance signal in a series tank input circuit;
   generating an oscillating current signal in response to the resonance signal being applied to a first amplifier and a second amplifier;
   applying the oscillating current signal to a first output tank so as to radiate first energy;
   applying the oscillating current signal to a second output tank so as to radiate second energy; and
   summing the first and second radiating energy from the first and second output tank so as to produce a summed radiating output.

18. The method as defined in claim 17 wherein said first and second output tanks each comprise an inductor.

* * * * *

UNITED STATES PATENT AND TRADEMARK OFFICE
CERTIFICATE OF CORRECTION

PATENT NO. : 5,486,793
DATED : Jan. 23, 1996
INVENTOR(S) : John P. Hill

It is certified that error appears in the above-indentified patent and that said Letters Patent is hereby corrected as shown below:

Title page, item [73],
Assignee: "United Technologies Automatove, Inc." should be
-- United Technologies Automotive, Inc. --.

Column 4, line 36: "≠ volt" should be -- +3 volt--.

Column 4, line 37: "≠ volts" should be -- +3 volts --.

Column 6, line 51: "≠ volts" should be -- +3 volts --.

Column 7, line 15: "≠ volts" should be -- +3 volts --.

Signed and Sealed this

Ninth Day of April, 1996

Attest:

BRUCE LEHMAN

Attesting Officer

Commissioner of Patents and Trademarks